United States Patent
Jou et al.

(10) Patent No.: US 9,780,211 B2
(45) Date of Patent: Oct. 3, 2017

(54) POWER CELL AND POWER CELL CIRCUIT FOR A POWER AMPLIFIER

(71) Applicants: Chewn-Pu Jou, Hsinchu (TW); Tzu-Jin Yeh, Hsinchu (TW); Chia-Chung Chen, Keelung (TW)

(72) Inventors: Chewn-Pu Jou, Hsinchu (TW); Tzu-Jin Yeh, Hsinchu (TW); Chia-Chung Chen, Keelung (TW)

(73) Assignee: TAIWAN SEMICONDUCTOR MANUFACTURING COMPANY, LTD., Hsinshu (TW)

(*) Notice: Subject to any disclaimer, the term of this patent is extended or adjusted under 35 U.S.C. 154(b) by 0 days.

(21) Appl. No.: 13/731,873

(22) Filed: Dec. 31, 2012

(65) Prior Publication Data

US 2014/0183660 A1    Jul. 3, 2014

(51) Int. Cl.
*H01L 27/088* (2006.01)
*H01L 29/78* (2006.01)
*H01L 29/66* (2006.01)

(52) U.S. Cl.
CPC ...... *H01L 29/785* (2013.01); *H01L 29/66901* (2013.01)

(58) Field of Classification Search
CPC ......... H01L 29/66803; H01L 29/41791; H01L 29/785; H01L 29/66901
USPC ........................................................ 257/401
See application file for complete search history.

(56) References Cited

U.S. PATENT DOCUMENTS

| | | | |
|---|---|---|---|
| 7,969,243 B2 | 6/2011 | Bracale et al. | |
| 2005/0167764 A1* | 8/2005 | Li | H01L 21/26506 257/406 |
| 2007/0155142 A1* | 7/2007 | Jin | H01L 29/7851 438/514 |
| 2010/0252816 A1* | 10/2010 | Ko | H01L 29/66818 257/24 |
| 2010/0276761 A1* | 11/2010 | Tung | H01L 29/41791 257/384 |
| 2011/0006348 A1* | 1/2011 | Cho | B82Y 10/00 257/252 |
| 2011/0291196 A1* | 12/2011 | Wei et al. | 438/283 |
| 2013/0141963 A1* | 6/2013 | Liaw | 365/156 |

* cited by examiner

*Primary Examiner* — Trung Q Dang
*Assistant Examiner* — Patricia Reddington
(74) *Attorney, Agent, or Firm* — Hauptman Ham, LLP

(57) ABSTRACT

A power cell includes a fin over a substrate, the fin extending in a direction substantially perpendicular to a bottom surface of the substrate. The fin includes a first dopant type. The power cell further includes at least one isolation region over the substrate between the fin and an adjacent fin. The power cell further includes a gate structure in contact with the fin and the at least one isolation region, wherein the gate structure comprises a doped region in the fin, wherein the doped region has a second dopant type different from the first dopant type and the doped region defines a channel region in the fin.

20 Claims, 7 Drawing Sheets

POWER CELL AND POWER CELL CIRCUIT FOR A POWER AMPLIFIER

BACKGROUND

A power amplifier is used in a variety of devices to increase a power of an input/output signal. The power amplifier is implemented using a power cell connected to a power supply. The power cell is configured to match a shape of the signal at a voltage level of the power supply, thereby changing the power of the signal to the voltage level of the power supply. The higher power signal is capable of being transmitted to another device or used within a device containing the power amplifier.

The power cell is subjected to high voltages during amplification of the signal which increases a risk of breakdown in the power cell. In some instances, breakdown is a result of hot carrier effect where a charge carrier, e.g., an electron or a hole, escapes from a channel of the power cell and enters another layer, e.g., a gate dielectric or a buried well. The hot carrier damages the other layer and causes short circuiting in some instances. The hot carrier effect is a concern in power cells because high magnitude voltages are applied to the power cell to increase the power of the signal.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1A:
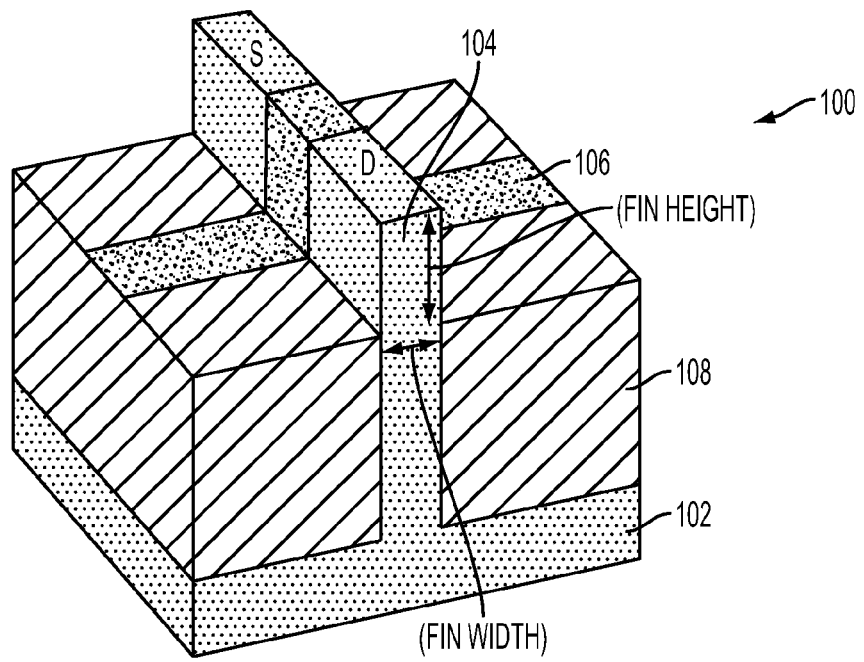
FIG. 1A is a perspective view of a power cell in accordance with one or more embodiments.

FIG. 1A is a perspective view of a power cell 100 in accordance with one or more embodiments. Power cell 100 includes a substrate 102 and a fin 104 extending in a substantially perpendicular direction to a top surface of the substrate. Fin 104 has a higher dopant concentration than substrate 102. Source and drain regions are formed within fin 104. Power cell 100 also includes a gate structure 106 extending across fin 104 between the source and drain regions in a direction substantially perpendicular to a width of the fin. Gate structure 106 defines a channel region in fin 104. Power cell 100 further includes isolation regions 108 over substrate 102. Isolation regions 108 are positioned to electrically isolate each fin 104 from adjacent fins.

In some embodiments, substrate 102 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, substrate 102 is a doped substrate. In some embodiments, substrate 102 is a high resistance substrate. In some embodiments, a resistance of substrate 102 is equal to or greater than 5K ohm-cm. If the resistance is less than 5K ohm-cm, current leakage through substrate 102 at high operating voltages causes power cell 100 to function improperly, in some embodiments. In some embodiments having the high resistance substrate, power cell 100 increases power added efficiency in comparison with embodiments which lack the high resistance substrate. In some embodiments having the high resistance substrate, power cell 100 provides a more uniform output voltage than embodiments which lack the high resistance substrate.

Fin 104 extends from substrate 102 in a direction substantially perpendicular to the top surface of the substrate. In some embodiments, fin 104 has a height above the top surface of substrate 102 ranging from about 2100 Angstroms (Å) to about 2500 Å. In some embodiments, fin 104 has a width extending in a direction parallel to gate structure 106 ranging from about 300 Å to about 1500 Å. In some embodiments, a height of fin 104 extending above isolation regions 108 ranges from about 15 nanometers (nm) to about 50 nm. In some embodiments, fin 104 is formed over substrate 102 by epitaxial growth, deposition or other suitable methods. In some embodiments, fin 104 is formed by etching substrate 102, such that the fin and the substrate are integral. In some embodiments, fin 104 has a dopant concentration ranging from about $1\times10^{17}$ atoms/cm$^3$ to about $1 \times 10^{19}$ atoms/cm$^3$. A dopant type of fin 104 is either n-type or p-type. N-type dopants include phosphorous, arsenic, antimony or other suitable n-type dopants. P-type dopants include boron, indium or other suitable p-type dopants. In some embodiments, fin 104 is doped by ion implantation. In some embodiments, fin 104 is doped by introducing dopants during the epitaxial growth process.

The source and drain regions of fin 104 have a higher doping concentration than the channel region of the fin under gate structure 106. In some embodiments, source and drain regions of fin 104 have a dopant concentration ranging from about $1 \times 10^{18}$ atoms/cm$^3$ to about $1 \times 10^{20}$ atoms/cm$^3$.

Gate structure 106 is a shallow doped layer extending over fin 104 between the source and drain regions in a direction substantially parallel to a width of the fin. Gate structure 106 has an opposite dopant type from fin 104. For example, if fin 104 includes n-type dopants, gate structure 106 includes p-type dopants. In some embodiments, gate structure 106 is formed by ion implantation in fin 104 and isolation regions 108. In some embodiments, a depth of gate structure 106 in fin 104 ranges from about 30 Å to about 150 Å. If a depth of gate structure 106 is less than about 30 Å, the gate structure does not provide sufficient charge carriers to form a channel in fin 104, in some instances. If a depth of a gate structure 106 is greater than about 150 Å, a size of the channel in fin 104 reduces conductivity of power cell 100 below an acceptable level, in some instances. In some embodiments, the depth of gate structure 106 is adjusted to select a cut-off voltage. In some embodiments, gate structure 106 has a dopant concentration greater than about $1 \times 10^{19}$ atoms/cm$^3$. If a dopant concentration of gate structure 106 is less than about $1 \times 10^{19}$ atoms/cm$^3$, the gate structure does not provide sufficient conductivity to efficiently activate power cell 100, in some instances.

Gate structure 106 and fin 104 form a three-dimensional channel. The channel formed by gate structure 106 and fin 104 is considered a three-dimensional channel because a channel length is capable of being changed in the fin width direction and the fin height direction. The three-dimensional channel positions a pinch-off point further away from an outer surface of fin 104 than other transistor designs. By locating the pinch-off point further from an outer surface of fin 104, the hot carrier effect is reduced and power cell 100 is capable of handling higher power applications than other transistor designs.

Isolation regions 108 electrically separate fin 104 from adjacent fins. In some embodiments, isolation regions are shallow trench isolation (STI), local oxidation of silicon (LOCOS), or other suitable isolation features. In some embodiments, isolation regions 108 are formed by etching substrate 102 to form an opening and filling the opening with non-conductive material. In some embodiments, isolation regions 108 have a height from the top surface of substrate 102 ranging from about 150 nm to about 300 nm. Gate structure 106 is formed in a top surface of isolation regions 108 between adjacent fins.

Figure 1B:
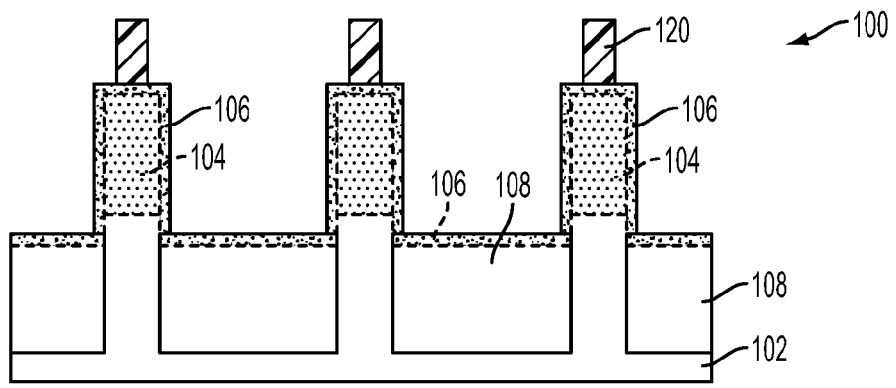
FIG. 1B is a cross sectional view of a power cell in accordance with one or more embodiments.

FIG. 1B is a cross section view of power cell 100 in accordance with one or more embodiments. Power cell 100 is a tri-gate structure because the power cell includes three fins 104 acting as transistor gates. In some embodiments, power cell 100 includes more or less than three gates. In some embodiments, the tri-gate structure of power cell 100 reduces a pinch-off voltage in comparison with a power cell having two gates.

Metal contacts 120 are formed on a top surface of gate structure 106. Metal contacts 120 form an ohmic contact with gate structure 106. In some embodiments, metal contacts 120 comprise tungsten, copper, aluminum or other suitable metal material. Metal contacts 120 are formed as separate contacts which are electrically connected by an inter-level dielectric structure (not shown). In some embodiments, metal contacts 120 are formed as a single contact electrically connected to gate structure 106 at each fin 104 of power cell 100.

Figure 1C:
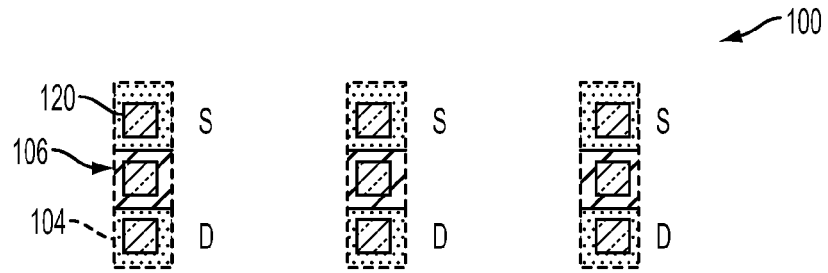
FIG. 1C is a top view of a gate structure of a power cell in accordance with one or more embodiments.

FIG. 1C is a top view of power cell 100 in accordance with one or more embodiments. Metal contacts 120 are formed on gate structure 106 for each fin 104 of the tri-grate structure. Metal contacts 120 are also formed on a source S and a drain D for each fin 104 of the tri-gate structure. Metal contacts 120 connected to sources S are formed as separate contacts which are electrically connected by the inter-level dielectric structure (not shown). In some embodiments, metal contacts 120 are formed as a single contact electrically connected to source S at each fin 104 of power cell 100. Metal contacts 120 connected to drains D are formed as separate contacts which are electrically connected by the inter-level dielectric structure (not shown). In some embodiments, metal contacts 120 are formed as a single contact electrically connected to drain D at each fin 104 of power cell 100.

Figure 2A:
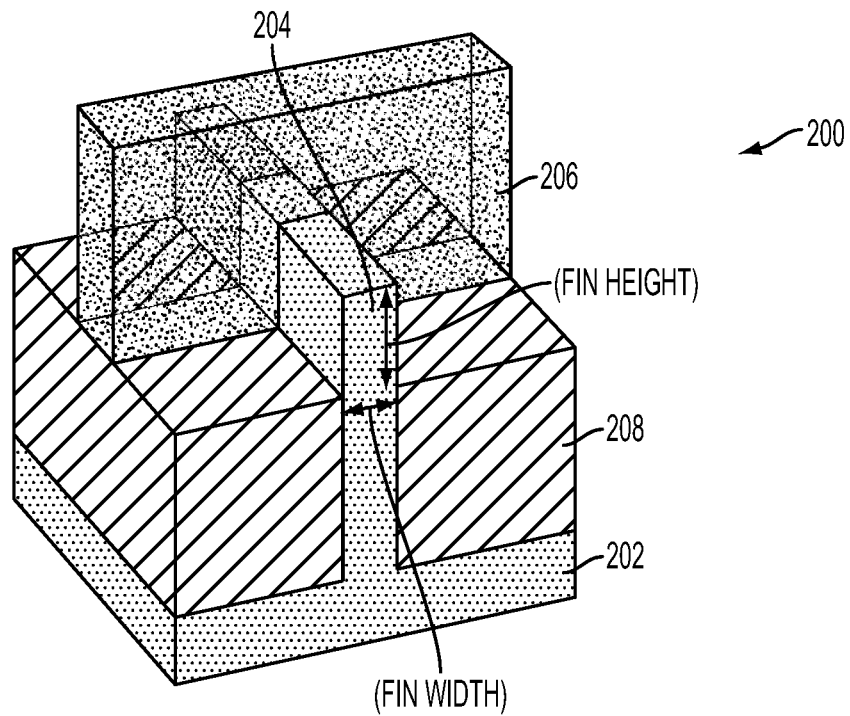
FIG. 2A is a perspective view of a power cell in accordance with one or more embodiments.

FIG. 2A is a perspective view of a power cell 200 in accordance with one or more embodiments. Power cell 200 includes a substrate 202 and a fin 204 extending in a substantially perpendicular direction to a bottom surface of the substrate. Fin 204 has a higher dopant concentration than substrate 202. Source and drain regions are formed within fin 204. Power cell 200 also includes a gate structure 206 extending across fin 204 between the source and drain regions in a direction substantially perpendicular to a width of the fin. Gate structure 206 defines a channel region in fin 204. Power cell 200 further includes isolation regions 208 over substrate 202. Isolation regions 208 are positioned to electrically isolate each fin 204 from adjacent fins.

Figure 2B:
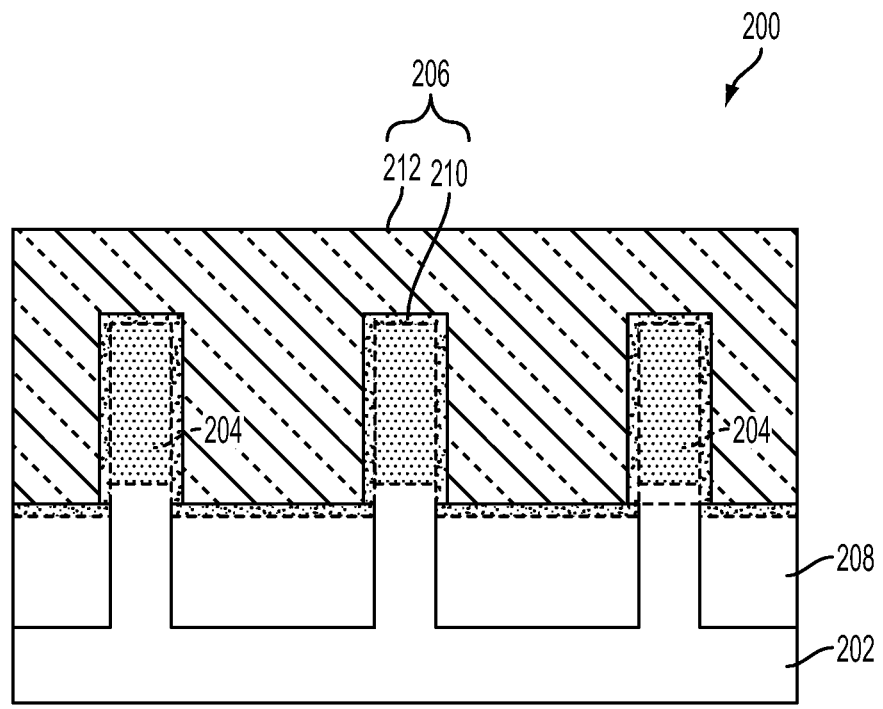
FIG. 2B is a cross sectional view of a power cell in accordance with one or more embodiments.

Substrate 202, fin 204 and isolation regions 208 are similar to substrate 102, fin 104 and isolation regions 108, respectively. Gate structure 206 is formed in fin 204 and over fin 204. FIG. 2B is a cross sectional view of power cell 200 in accordance with one or more embodiments. Power cell 200 is a tri-gate structure similar to power cell 100. In some embodiments, power cell 200 has more or less than three gates. Gate structure 206 includes a doped region 210 similar to gate structure 106. Doped region 210 has an opposite dopant type from fin 204. Gate structure 206 further includes a gate electrode 212 over doped region 210. Gate electrode 212 is a continuous layer over a top surface of doped region 210. Gate electrode 212 forms an ohmic contact with fin 204.

Gate electrode 212 is disposed over doped region 210 and is configured to receive a signal to selectively activate charge transfer through fin 204. In some embodiments, gate electrode 212 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. In some embodiments, the conductive material of gate electrode 212 is doped or undoped depending on design requirements of field effect transistor devices of an integrated circuit. In some embodiments, gate electrode 212 includes a work function layer tuned to have a proper work function for enhanced performance of the field effect transistor devices. For example, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof. In some embodiments, a conductive layer, such as an aluminum layer, is formed over the work function layer, such that the gate electrode includes a work function layer disposed over a gate dielectric layer and a conductive layer disposed over the work function layer.

Figure 2C:
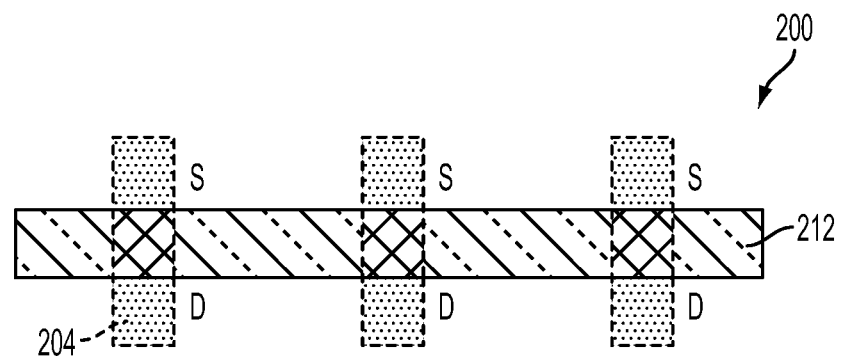
FIG. 2C is a top view of a gate structure of a power cell in accordance with one or more embodiments.

FIG. 2C is a top view of power cell 200 in accordance with one or more embodiments. Gate structure 206 is a continuous layer substantially covering a channel portion of each fin 204 of the tri-grate structure. Source S and drain D regions of fins 204 are located on opposite sides of gate structure 206. Gate structure 206 is configured to receive a gate signal from an inter-level dielectric structure (not shown) in order to selectively activate power cell 200. Source S regions are configured to receive a source signal from the inter-level dielectric structure. In some embodiments, source S regions of power cell 200 are electrically connected to one another to receive a same source signal. Drain D regions are configured to receive a drain signal from the inter-level dielectric structure. In some embodiments, drain D regions of power cell 200 are electrically connected to one another to receive a same drain signal.

Figure 3A:
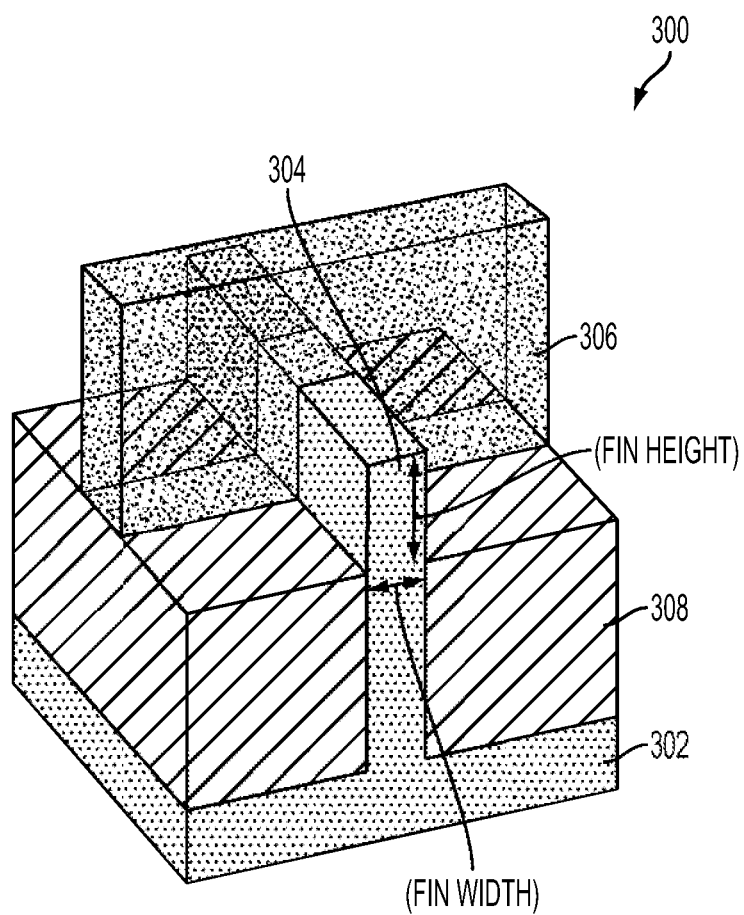
FIG. 3A is a perspective view of a power cell in accordance with one or more embodiments.

FIG. 3A is a perspective view of a power cell 300 in accordance with one or more embodiments. Power cell 300 includes a substrate 302 and a fin 304 extending in a substantially perpendicular direction to a bottom surface of the substrate. Fin 304 has a higher dopant concentration than substrate 302. Source and drain regions are formed within fin 304. Power cell 300 also includes a gate structure 306 extending across fin 304 between the source and drain regions in a direction substantially perpendicular to a width of the fin. Gate structure 306 defines a channel region in fin 304. Power cell 300 further includes isolation regions 308 over substrate 302. Isolation regions 308 are positioned to electrically isolate each fin 304 from adjacent fins.

Figure 3B:
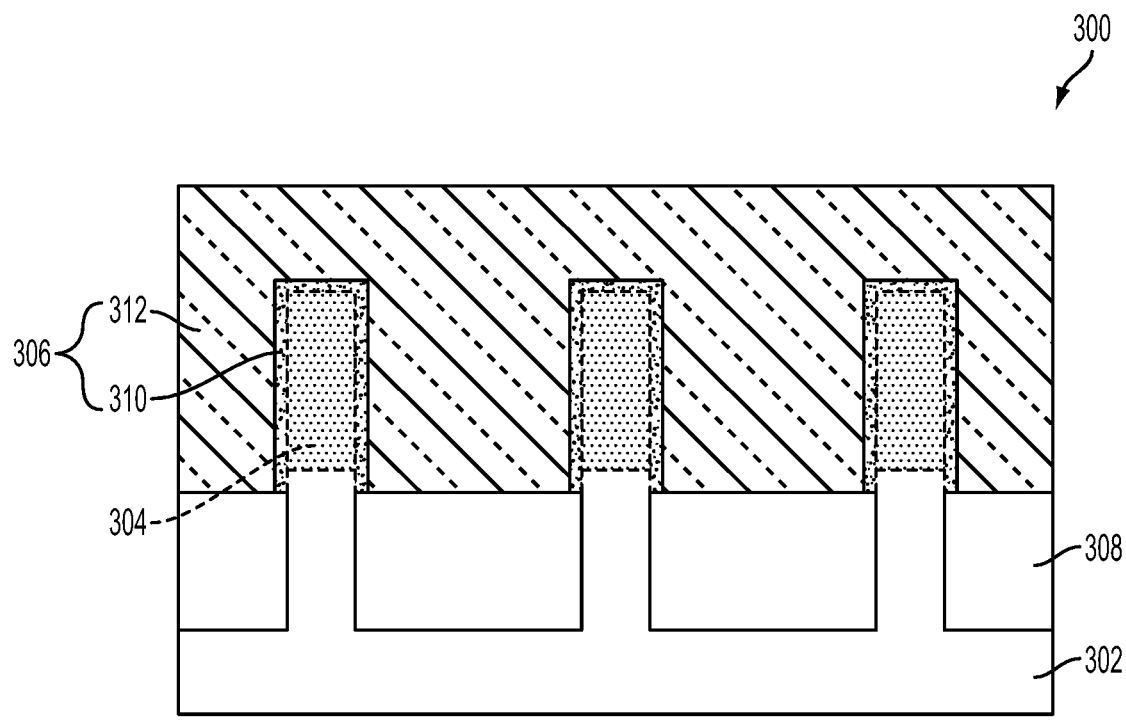
FIG. 3B is a cross sectional view of a power cell in accordance with one or more embodiments.

Substrate 302, fin 304 and isolation regions 308 are similar to substrate 102, fin 104 and isolation regions 108, respectively. Gate structure 306 is formed over fin 204. FIG. 3B is a cross sectional view of power cell 300 in accordance with one or more embodiments. Power cell 300 is a tri-gate structure similar to power cell 100. In some embodiments, power cell 300 has more or less than three gates. Gate structure 306 includes a gate dielectric layer 310 over fin 304 and a gate electrode 312 over gate dielectric layer 310. Gate electrode 312 is similar to gate electrode 212 of power cell 200.

Gate dielectric layer 310 separates gate electrode 312 from fin 304. In some embodiments, gate dielectric layer 310 comprises a high-k dielectric material. A high-k dielectric material has a dielectric constant (k) higher than the dielectric constant of silicon dioxide. In some embodiments, the high-k dielectric material has a k value greater than 3.9. In some embodiments, the high-k dielectric material has a k value greater than 8.0. In some embodiments, gate dielectric layer 118 comprises silicon dioxide ($SiO_2$), silicon oxynitride (SiON), hafnium dioxide ($HfO_2$), zirconium dioxide ($ZrO_2$) or other suitable materials. In some embodiments, gate dielectric layer 310 has a thickness ranging from 60 Angstroms (Å) to 80 Å. If the thickness is less than 60 Å, gate dielectric layer 310 will break down if a high voltage is conducted through power cell 100, in some embodiments. If the thickness is greater than 80 Å, gate electrode 312 cannot efficiently activate charge transfer through channel layer 108, in some embodiments.

Figure 3C:
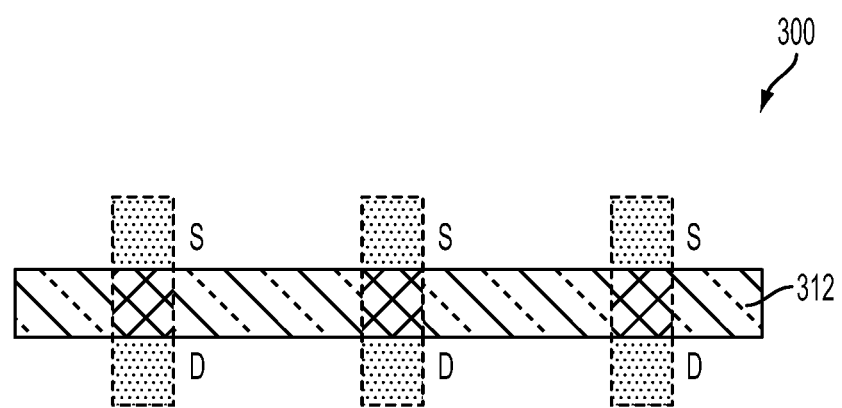
FIG. 3C is a top view of a gate structure of a power cell in accordance with one or more embodiments.

FIG. 3C is a top view of power cell 300 in accordance with one or more embodiments. Gate structure 306 is a continuous layer substantially covering a channel portion of each fin 304 of the tri-grate structure. Source S and drain D regions of fins 304 are located on opposite sides of gate structure 306. Gate structure 306 is configured to receive a gate signal from an inter-level dielectric structure (not shown) in order to selectively activate power cell 300. Source S regions are configured to receive a source signal from the inter-level dielectric structure. In some embodiments, source S regions of power cell 300 are electrically connected to one another to receive a same source signal. Drain D regions are configured to receive a drain signal from the inter-level dielectric structure. In some embodiments, drain D regions of power cell 300 are electrically connected to one another to receive a same drain signal.

Figure 4A:
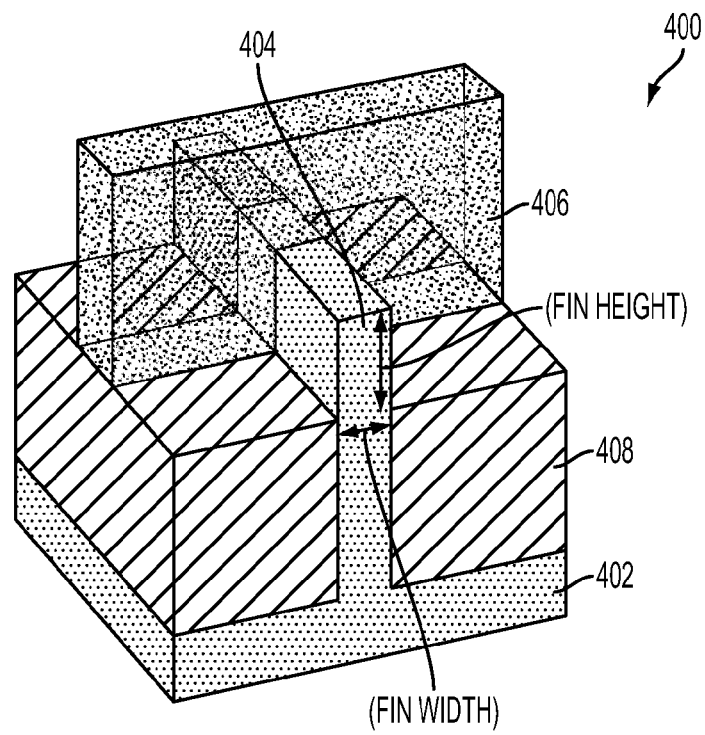
FIG. 4A is a perspective view of a power cell in accordance with one or more embodiments.

FIG. 4A is a perspective view of a power cell 400 in accordance with one or more embodiments. Power cell 400 includes a substrate 402 and a fin 404 extending in a substantially perpendicular direction to a bottom surface of the substrate. Fin 404 has a higher dopant concentration than substrate 402. Source and drain regions are formed within fin 404. Power cell 400 also includes a gate structure 406 extending across fin 404 between the source and drain regions in a direction substantially perpendicular to a width of the fin. Gate structure 406 defines a channel region in fin 404. Power cell 400 further includes isolation regions 408 over substrate 402. Isolation regions 408 are positioned to electrically isolate each fin 404 from adjacent fins.

Figure 4B:
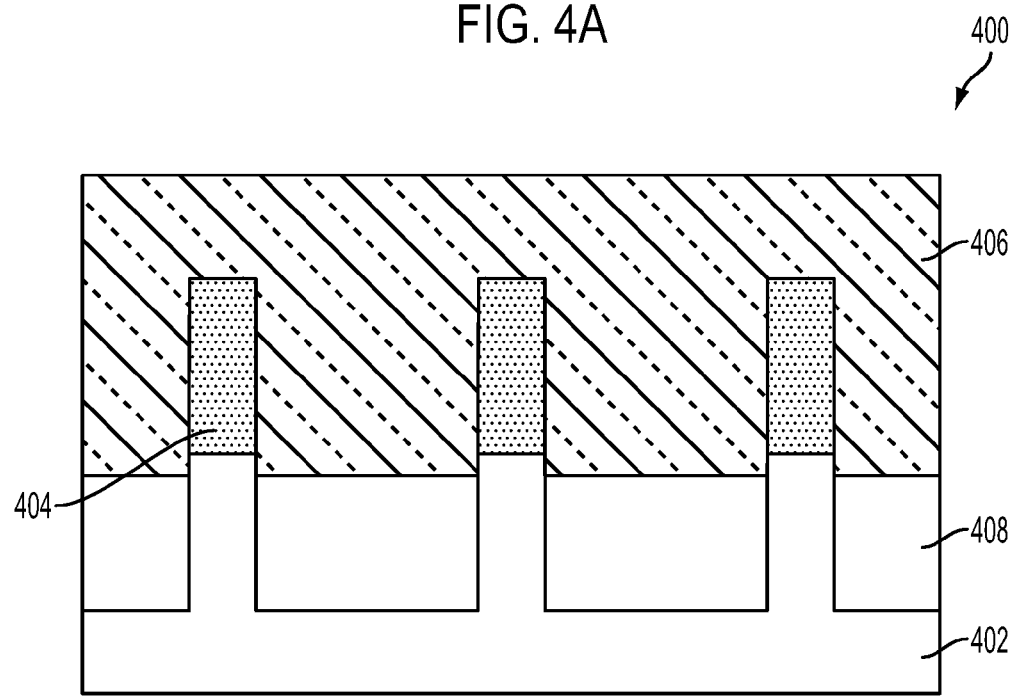
FIG. 4B is a cross sectional view of a power cell in accordance with one or more embodiments.

Substrate 402, fin 404 and isolation regions 408 are similar to substrate 102, fin 104 and isolation regions 108, respectively. Gate structure 406 is formed over fin 204. FIG. 4B is a cross sectional view of power cell 400 in accordance with one or more embodiments. Power cell 400 is a tri-gate structure similar to power cell 100. In some embodiments, power cell 400 has more or less than three gates. Gate structure 406 includes metal layer over fin 404. Gate structure 406 forms a Schottky contact with fin 404.

Gate structure 406 is electrically connected to fin 404 and a Schottky barrier is formed at an interface of the gate structure and the fin. In some embodiments, gate structure 406 comprises tungsten. In some embodiments, gate structure 406 comprises aluminum, copper, molybdenum, platinum, chromium, or other suitable metal material. In operation, gate structure 406 functions similar to a combination of gate electrode 312 and gate dielectric layer 310 to control charge transfer in fin 404.

Figure 4C:
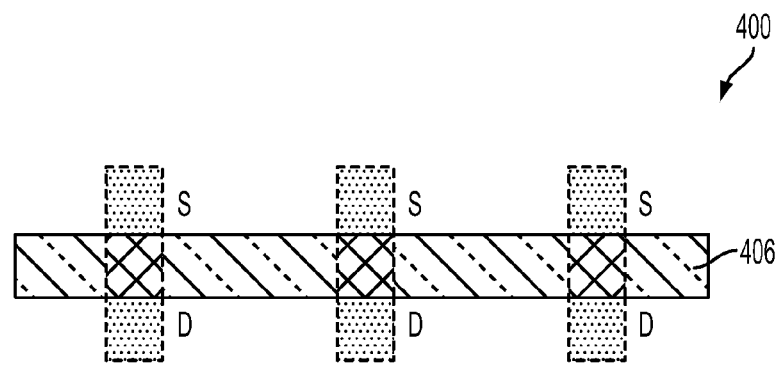
FIG. 4C is a top view of a gate structure of a power cell in accordance with one or more embodiments.

FIG. 4C is a top view of power cell 400 in accordance with one or more embodiments. Gate structure 406 is a continuous layer substantially covering a channel portion of each fin 404 of the tri-grate structure. Source S and drain D regions of fins 404 are located on opposite sides of gate structure 406. Gate structure 406 is configured to receive a gate signal from an inter-level dielectric structure (not shown) in order to selectively activate power cell 400. Source S regions are configured to receive a source signal from the inter-level dielectric structure. In some embodiments, source S regions of power cell 400 are electrically connected to one another to receive a same source signal. Drain D regions are configured to receive a drain signal from the inter-level dielectric structure. In some embodiments, drain D regions of power cell 400 are electrically connected to one another to receive a same drain signal.

Figure 5:
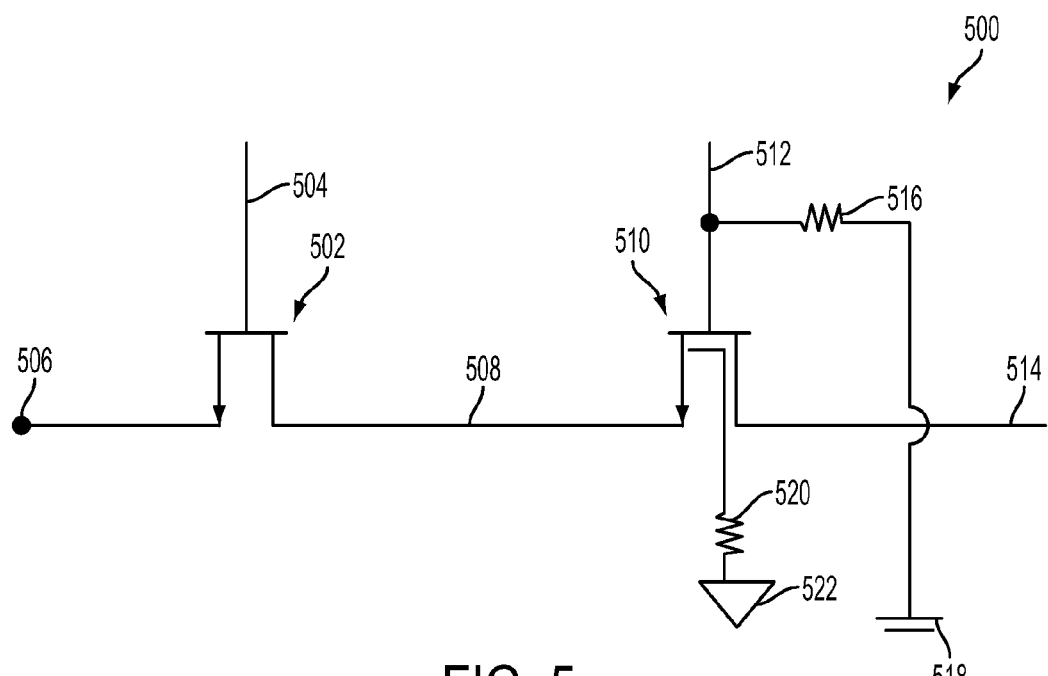
FIG. 5 is a schematic diagram of a power circuit in accordance with one or more embodiments.

FIG. 5 is a schematic diagram of a power circuit 500 in accordance with one or more embodiments. Power circuit 500 includes a first device 502 configured to receive a first input signal 504 and a supply voltage 506 and output a first output 508. Power circuit further includes a second device 508 configured to receive a second input signal 510 and first output 508 and output an output signal 514. Power circuit 500 further includes a first resistor 516 having a first side configured to receive second input signal 512 and a second side connected to a first bias source 518. Power circuit 500 further includes a second resistor 520 having a first side connected to second device 510 and a second side connected to a second bias source 522.

In some embodiments, first device 502 is power cell 100. In some embodiments, first device 502 is power cell 200, 300 or 400. In some embodiments, first device 502 is a high voltage metal oxide semiconductor (MOS) transistor. First device 502 of power circuit 500 is an n-type device. In some embodiments, first device 502 is a p-type device. First device 502 is configured to be controlled by first input signal 504. In embodiments where first device 502 is power cell 100, first input signal 504 is received at metal layer 120 to control charge transfer in fin 104 through gate structure 106. In embodiments where first device 502 is power cell 200, first input signal 504 is received at gate electrode 212 to control charge transfer in fin 204. In embodiments where first device 502 is power cell 300, first input signal 504 is received at gate electrode 312 to control charge transfer in fin 304. In embodiments where first device 502 is power cell 400, first input signal 504 is received at gate structure 406 to control charge transfer in fin 404.

First input signal 504 corresponds to a signal to be amplified by power circuit 500. In some embodiments, first input signal 504 is received from a signal source, e.g. a transceiver. Supply voltage 506 is the operating voltage of first device 502 and second device 510. In some embodiments supply voltage 506 is provided by a power supply circuit or other suitable circuitry.

In some embodiments, second device 510 is power cell 100. In some embodiments, second device 510 is power cell 200, 300 or 400. Second device 510 of power circuit 500 is an n-type device. In some embodiments, second device 510 is a p-type device. Second device 510 is configured to be controlled by a second input signal 512. In embodiments where second device 510 is power cell 100, first input signal 504 is received at metal layer 120 to control charge transfer in fin 104 through gate structure 106. In embodiments where second device 510 is power cell 200, first input signal 504 is received at gate electrode 212 to control charge transfer in fin 204. In embodiments where second device 510 is power cell 300, first input signal 504 is received at gate electrode 312 to control charge transfer in fin 304. In embodiments where second device 510 is power cell 400, first input signal 504 is received at gate structure 406 to control charge transfer in fin 404. In some embodiments, second device 510 has a same structure as first device 502. In some embodiments, second device 510 has a different structure from first device 502.

Second input signal 512 corresponds to the signal to be amplified by power circuit 500. In some embodiments, second input signal 512 is received from a signal source, e.g. a transceiver. In some embodiments, second input signal 512 is a same signal as first input signal 504. In some embodiments, second input signal 512 is different from first input signal 504. In embodiments where second input signal 512 is different from first input signal 504, circuitry positioned between the signal source and second device 510 modifies the first input signal to generate the second input signal.

Output signal 514 has a similar shape as the input signal, but has an increased power with respect to the input signal.

In some embodiments, a resistance of first resistor 516 is equal to or greater than 5K ohm-cm. In some embodiments, first resistor 516 and first bias source 518 are omitted. In some embodiments, a resistance of second resistor 520 is equal to or greater than 5K ohm-cm. In some embodiments, second resistor 520 has a same resistance as first resistor 516. In some embodiments, second resistor 520 has a different resistance than first resistor 516.

In some embodiments, first bias source 518 is ground. In some embodiments, first bias source 518 is a negative voltage. In some embodiments, first bias source 518 provides a voltage of about −10V. In some embodiments, second bias source 522 is ground or a negative voltage. In some embodiments, second bias source 522 has a same voltage as first bias source 518. In some embodiments, second bias source 522 has a different voltage from first bias source 518.

Figure 6:
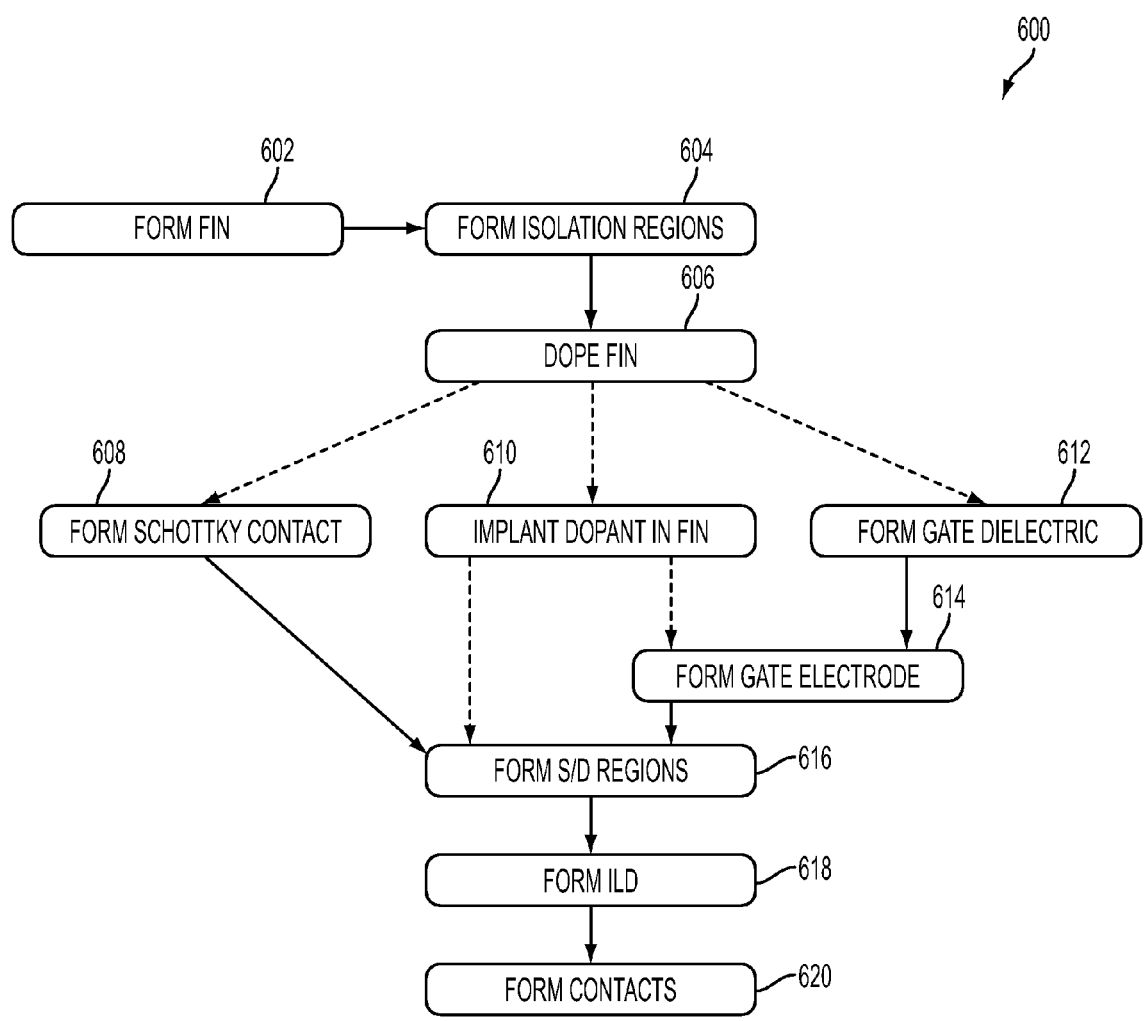
FIG. 6 is a flow chart of a method of making a power cell in accordance with one or more embodiments.

FIG. 6 is a flow chart of a method 600 of making a power cell according to one or more embodiments. Method 600 begins with operation 602 in which a fin is formed. In some embodiments, the fin is formed by epitaxially growing the fin on a substrate. In some embodiments, the fin is epitaxially grown on a substrate by depositing a dummy layer on the substrate and etching an opening into the dummy layer. The fin is grown in the opening in the dummy layer and the dummy layer is removed. In some embodiments, the fin is formed by etching the substrate. In some embodiments, a mask layer is formed over a portion of the substrate corresponding to the fin and adjacent portions of the substrate are etched to define the fin. In some embodiments, the fin is doped.

Method 600 continues with operation 604 in which isolation regions are formed. In some embodiments where the fin is formed by etching the substrate, the isolation regions are formed by depositing or growing a non-conductive material in the etched adjacent portions of the substrate. In some embodiments, the isolation regions are formed by epitaxial growth. In some embodiments, the isolation regions are formed by physical vapor deposition (PVD), chemical vapor deposition (CVD), sputtering or other suitable deposition process. In some embodiments, a planarization or etching process follows the deposition process to remove unwanted non-conductive material. In some embodiments, isolation regions are formed by forming a dummy layer on the substrate and etching an opening into the dummy layer. The non-conductive material is then deposited or grown into the opening and the dummy layer is removed.

In operation 606, the fin is doped. In some embodiments, the fin is doped by ion implantation. In some embodiments, the ion implantation is performed at an angle with respect to a top surface of the substrate. In some embodiments, the fin is doped by introducing dopants during an epitaxial growth process. Following operation 606, the next step in method 600 depends on the type of power cell to be formed. If a power cell similar to power cell 400 is to be formed, method 600 continues with operation 608. If a power cell similar to power cell 100 or 200 is to be formed, method 600 continues with operation 610. If a power cell similar to power cell 300 is to be formed, method 600 continues with operation 612.

In operation 608, a Schottky contact is formed. The Schottky contact is formed by depositing a metal layer as a gate structure over the fin so that the metal layer and the fin form a Schottky diode. In some embodiments, the metal layer is gate structure 406 (FIGS. 4A-C). In some embodiments, the metal layer comprises tungsten, aluminum, copper or other suitable metal material. In some embodiments, the metal layer is deposited by PVD, sputtering, atomic layer deposition (ALD) or other suitable deposition techniques. Following operation 608, method 600 continues with operation 616.

In operation 610, a dopant is implanted into the fin. The dopant has an opposite dopant type from the fin and is shallowly deposited in the fin. The dopant defines a channel region of the fin. In some embodiments, the dopant is formed as gate structure 106 (FIGS. 1A-C). In some embodiments, the dopant is formed as doped region 210 (FIGS. 2B-C). In some embodiments, the fin is doped by ion implantation. In some embodiments, the ion implantation is angled with respect to the top surface of the substrate. Following operation 610, the next step in method 600 depends on a type of power cell to be formed. If a power cell similar to power cell 100 is to be formed, method 600 continues with operation 616. If a power cell similar to power cell 200 is to be formed, method 600 continues with operation 614.

In operation 612, a gate dielectric layer is formed. The gate dielectric layer is formed over the fin to define a channel region. In some embodiments, the gate dielectric layer is gate dielectric layer 310 (FIGS. 3B-C). In some embodiments, the gate dielectric layer is formed by CVD, PVD, ALD, sputtering or other suitable techniques. Following operation 612, method 600 continues with operation 614.

In operation 614, a gate electrode is formed. The gate electrode is formed over the dopant implanted in operation 610 or the gate dielectric layer of operation 612. In some embodiments, the gate electrode is gate electrode 212. In some embodiments, the gate electrode is gate electrode 312. In some embodiments, the gate electrode is formed by PVD, CVD, ALD, or other suitable techniques. Following operation 614, method 600 continues with operation 616.

In operation 616, source and drain regions are formed. The channel region is defined in operation 608, 610 or 612. Portions of the fin on opposite sides of the channel region are doped to a higher dopant concentration to form the source and drain regions. In some embodiments, the source and drain regions formed by ion implantation. In some embodiments, the source and drain regions are formed by etching a portion of the fin and growing the source and drain regions in the etched portion of the fin. In some embodiments, a gate structure, e.g., gate structure 106, 206, 306 or 406 is used as a mask for the ion implantation or the etching process.

In operation 618, an inter-level dielectric (ILD) is formed. The ILD is used to provide electrical connection between various external components and the power cell. In some embodiments, electrical connections between multiple gates of the power cell are provided in the ILD. In some embodiments, the ILD is formed by depositing a dielectric material and etching openings in the dielectric material. The openings are then filled with conductive material to form the electrical connections.

In operation 620, contacts are formed. The contacts provide electrical connection between the ILD and the power cell. In some embodiments, the contacts are contacts 120 (FIGS. 1A-C). In some embodiments, the contacts are formed by etching an opening in the ILD and forming the contacts in the opening. In some embodiments, the contacts are formed by PVD, sputtering, ALD or other suitable techniques. In some embodiments, the contacts are silicide layers. In some embodiments, the contacts are formed using a combination of a deposition process and an annealing process.

The structure of power cells 100, 200, 300 and 400 and power circuit 500 provide advantages over other approaches because the features of the power cells and power circuit are capable of being formed using complementary metal oxide semiconductor (CMOS) process technology. In some approaches, electronic devices containing power amplifiers are formed using several different components formed using several different process technologies. For example, in a different approach, an electronic device includes a duplexer and a bandpass filter formed using micro electrical mechanical (MEMS) processing technology; a power amplifier formed using gallium arsenide (GaAs) processing technology and integrated circuits formed using CMOS technology. By forming the electronic device with a variety of processing technologies, complexity of the electronic device is increased because the different process technologies are connected to one another resulting in increased circuitry. The increased circuitry increases an overall size of the electronic device. The variety of processing technologies also increase production time and cost. The structure of power cells 100, 200, 300 and 400 and power circuit 500 allow the power amplifier to be formed using CMOS processing technology which reduces complexity of the electronic device and increases production efficiency.

The structure of power cells 100, 200, 300 and 400 and power circuit 500 also provides advantages over other approaches because the power cells are capable of handling higher voltages than the other approaches. In some embodiments, power cells 100, 200, 300 and 400 have a breakdown voltage greater than 12 V. The increased breakdown voltage in comparison with other approaches allows power cells 100, 200, 300 and 400 to replace devices formed using expensive specialized materials.

One aspect of this description relates to a power cell. The power cell includes a fin over a substrate, the fin extending in a direction substantially perpendicular to a bottom surface of the substrate, wherein the fin comprises a first dopant type. The power cell further includes at least one isolation region over the substrate between the fin and an adjacent fin. The power cell further includes a gate structure in contact with the fin and the at least one isolation region, wherein the gate structure comprises a doped region in the fin, wherein the doped region has a second dopant type different from the first dopant type and the doped region defines a channel region in the fin.

Another aspect of this description relates to a power cell. The power cell includes a fin over a substrate, the fin extending in a direction substantially perpendicular to a bottom surface of the substrate, wherein the fin comprises a first dopant type. The power cell further includes at least one isolation region over the substrate between the fin and an adjacent fin. The power cell further includes a gate structure in contact with the fin and the at least one isolation region, wherein the gate structure comprises a metal layer over the fin, wherein the metal layer defines a channel region in the fin.

Still another aspect of this description relates to a power circuit. The power circuit includes a first device, the first device configured to receive a power supply and a first input signal and to output a first output signal. The power circuit further includes a second device, the second device configured to receive a second input signal and the first output signal and to output a second output signal. The second device includes a fin over a substrate, the fin extending in a direction substantially perpendicular to a bottom surface of the substrate, wherein the fin comprises a first dopant type. The second device further includes at least one isolation region over the substrate between the fin and an adjacent fin. The second device further includes a gate structure in contact with the fin and the at least one isolation region, wherein the gate structure comprises a doped region in the fin, wherein the doped region has a second dopant type different from the first dopant type and the doped region defines a channel region in the fin.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A power cell comprising:
   a fin over a substrate, the fin extending in a first direction substantially perpendicular to a bottom surface of the substrate, wherein the fin comprises a first doped region having a first dopant type;
   at least one isolation region over the substrate between the fin and an adjacent fin, wherein a bottom surface of the first doped region is farther from the bottom surface of the substrate than a top surface of the at least one isolation region, a second doped region extends continuously across the isolation region, the second doped region extends into the fin, and a dimension of the second doped region in the isolation region in a second direction perpendicular to the first direction is less than a dimension of the at least one isolation region in the second direction; and
   a gate structure in contact with the fin and the at least one isolation region, wherein the gate structure comprises a metal layer over the fin, wherein the metal layer defines a three-dimensional channel region in the fin.

2. The power cell of claim 1, wherein the second doped region has a second dopant type opposite the first dopant type.

3. The power cell of claim 1, wherein the metal layer and the fin form a Schottky contact.

4. The power cell of claim 1, wherein the metal layer and the fin form an ohmic contact.

5. The power cell of claim 1, wherein the power cell is a tri-gate power cell having three fins and the at least one isolation region is positioned between each of the three fins.

6. The power cell of claim 5, wherein the gate structure is continuous across all of the three fins.

7. The power cell of claim 1, wherein the substrate has a resistance greater than 5K ohm-cm.

8. A power cell comprising:
   a fin over a substrate, the fin extending in a first direction substantially perpendicular to a bottom surface of the substrate, wherein the fin comprises a first doped region having a first dopant type;
   at least one isolation region over the substrate between the fin and an adjacent fin, wherein a bottom surface of the first doped region is farther from the bottom surface of the substrate than a top surface of the at least one isolation region, a top portion of the at least one isolation region includes a second doped region, and a width of the second doped region in a direction perpendicular to the first direction is less than a width of the at least one isolation structure; and
   a gate structure in contact with the fin and the at least one isolation region, wherein the gate structure is substantially perpendicular to the fin, wherein the gate structure comprises a metal layer over the fin, wherein the metal layer defines a channel region in the fin.

9. The power cell of claim 8, wherein the second doped region is part of the gate structure.

10. The power cell of claim 8, wherein the metal layer and the fin form a Schottky contact.

11. The power cell of claim 8, wherein the metal layer and the fin form an ohmic contact.

12. The power cell of claim 8, wherein the power cell is a tri-gate power cell having three fins and the at least one isolation region is positioned between each of the three fins.

13. The power cell of claim 12, wherein the gate structure is continuous across all of the three fins.

14. A power cell comprising:
    a fin over a substrate, the fin extending in a direction substantially perpendicular to a bottom surface of the substrate, wherein the fin comprises a first doped region having an N type dopant;
    at least one isolation region over the substrate between the fin and an adjacent fin, wherein a bottom surface of the first doped region is farther from the bottom surface of the substrate than a top surface of the at least one isolation region, a top portion of the at least one isolation region comprises a second doped region, an area of the second doped region is less than an area of a top surface of the at least one isolation region, and the top portion in physical contact with the doped region of the fin;
    a gate structure in contact with the fin and the at least one isolation region, wherein the gate structure comprises a metal layer over the fin, wherein the metal layer defines a three-dimensional channel region in the fin.

15. The power cell of claim 14, wherein the second doped region has a P type dopant.

16. The power cell of claim 14, wherein the metal layer and the fin form a Schottky contact.

17. The power cell of claim 14, wherein the metal layer and the fin form an ohmic contact.

18. The power cell of claim 8, wherein the power cell is a tri-gate power cell having three fins and the at least one isolation region is positioned between each of the three fins.

19. The power cell of claim 18, wherein the gate structure is continuous across all of the three fins.

20. The power cell of claim 1, wherein a top of the second doped region is coplanar with a top of the at least one isolation region.

* * * * *